United States Patent
Ichihara

(10) Patent No.: US 9,607,694 B1
(45) Date of Patent: Mar. 28, 2017

(54) SEMICONDUCTOR MEMORY DEVICE AND METHOD OF CONTROLLING THE SAME

(71) Applicant: Kabushiki Kaisha Toshiba, Minato-ku (JP)

(72) Inventor: Reika Ichihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/071,462

(22) Filed: Mar. 16, 2016

(30) Foreign Application Priority Data

Sep. 17, 2015 (JP) .................................. 2015-184187

(51) Int. Cl.
G11C 11/00 (2006.01)
G11C 13/00 (2006.01)

(52) U.S. Cl.
CPC .................................. G11C 13/004 (2013.01)

(58) Field of Classification Search
USPC .................. 365/148, 163, 158, 171, 173
See application file for complete search history.

(56) References Cited

U.S. PATENT DOCUMENTS

2004/0042286 A1* 3/2004 Kato .................... G11C 7/1048 365/200
2008/0056005 A1* 3/2008 Aritome .............. G06F 11/1068 365/185.21

* cited by examiner

Primary Examiner — Han Yang
(74) Attorney, Agent, or Firm — Oblon, McClelland, Maier & Neustadt, L.L.P.

(57) ABSTRACT

A semiconductor memory device according to the embodiments includes a first wiring, a second wiring that extends to intersect with the first wiring, a memory cell that is disposed on each intersection portion of the first wiring and the second wiring, and includes a variable resistive element, and a control circuit to control a voltage applied to the memory cell. The control circuit applies a read voltage with respect to the memory cell for a plurality of times to determine a resistive state of the memory cell for a plurality of times, so as to obtain a first determination result or a second determination result. The control circuit compares the number of the first determination result with the number of the second determination result, terminates a reading operation when the comparison result satisfies a certain condition, and starts the reading operation again when the condition is not satisfied.

20 Claims, 6 Drawing Sheets

SEMICONDUCTOR MEMORY DEVICE AND METHOD OF CONTROLLING THE SAME

CROSS REFERENCE TO RELATED APPLICATIONS

This application is based on and claims the benefit of priority from prior Japanese Patent Application No. 2015-184187, filed on Sep. 17, 2015, the entire contents of which are incorporated herein by reference.

FIELD

Embodiments described herein relate generally to a semiconductor memory device and a method of controlling the same.

BACKGROUND

Recently, as a subsequent candidate of a flash memory, attention has been focused on a resistance change memory device that uses a variable resistive element as a storage element. A memory cell array as the resistance change memory device disposes a memory cell that includes the variable resistive element on an intersection portion of a bit line and a word line. This memory cell array can use a property of the variable resistive element to select the memory cell. Laminating the bit line and the word line in alternation to laminate the memory cell array three-dimensionally realizes a high-density memory cell array to increase capacity.

While the capacity of the memory cell array has been increased, a current that each memory cell requires in operation is preferred to be reduced. However, with the reduction of a read current of the memory cell, a noise (read noise) where the read current repeats increase and decrease has been actualized. The generation of the read noise possibly causes erroneous determination where a high resistance state is determined to be a low resistance state, and the low resistance state is determined to be the high resistance state.

DETAILED DESCRIPTION

A semiconductor memory device according to embodiments includes a first wiring, a second wiring that extends to intersect with the first wiring, a memory cell that is disposed on each intersection portion of the first wiring and the second wiring, and includes a variable resistive element, and a control circuit to control a voltage applied to the memory cell. The control circuit applies a read voltage with respect to the memory cell for a plurality of times to determine a resistive state of the memory cell for a plurality of times, so as to obtain a first determination result or a second determination result. The control circuit compares the number of the first determination result with the number of the second determination result, terminates a reading operation when the comparison result satisfies a certain condition, and starts the reading operation again when the condition is not satisfied.

The following describes embodiments of the semiconductor memory device and a method of controlling the semiconductor memory device with reference to the drawings.

First Embodiment

Figure 1:
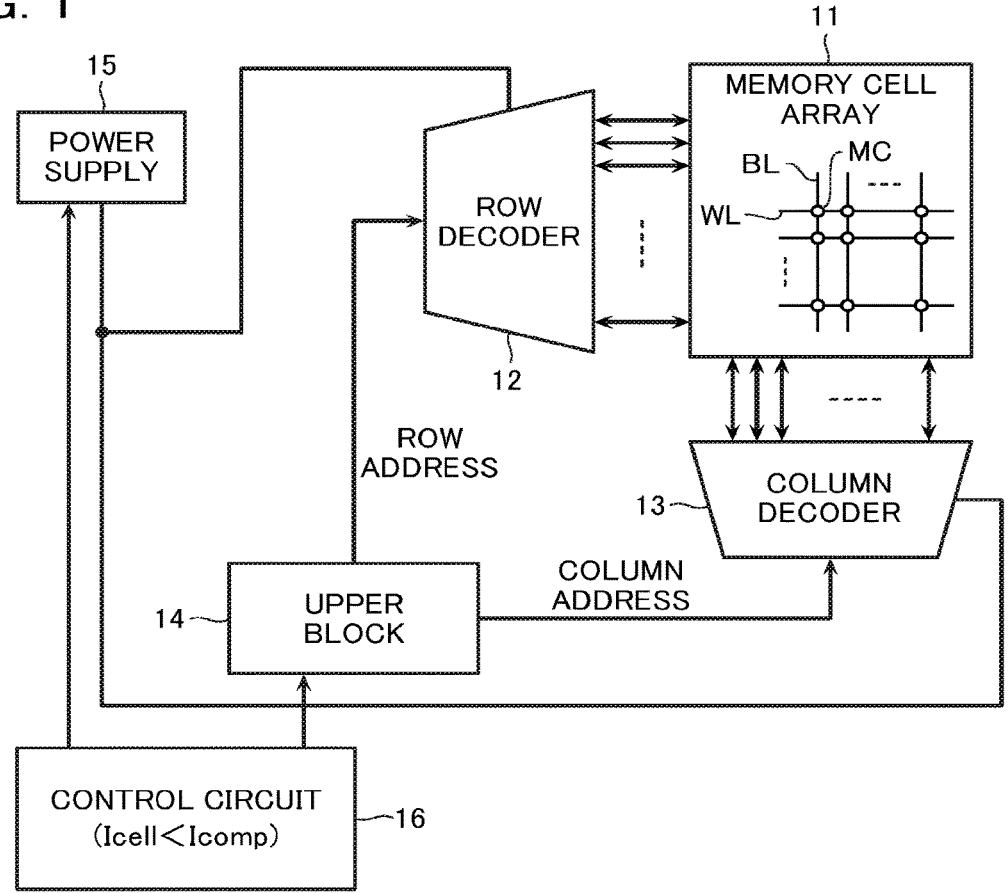
FIG. 1 is an exemplary block diagram of a semiconductor memory device according to a first embodiment.

Firstly, a description will be given of an overall configuration of the semiconductor memory device according to a first embodiment. FIG. 1 is an exemplary block diagram of the semiconductor memory device according to the embodiment. As illustrated in FIG. 1, the semiconductor memory device includes a memory cell array 11, a row decoder 12, a column decoder 13, an upper block 14, a power supply 15, and a control circuit 16.

The memory cell array 11 includes a plurality of word lines WL and bit lines BL, which intersect with one another, and memory cells MC, which are disposed in the respective intersection portions of these lines. The row decoder 12 selects the word line WL for access (writing/erasure/reading). The column decoder 13 includes a driver that selects the bit line BL for access to control an access operation.

The upper block 14 selects a memory cell MC in the memory cell array 11 to be accessed. The upper block 14 gives a row address and a column address to the row decoder 12 and the column decoder 13, respectively. The power supply 15 generates combinations of certain voltages corresponding to the respective operations of data erasure/writing/reading, and supplies the voltages to the row decoder 12 and the column decoder 13.

The control circuit 16 performs a control such as transmission of an address to the upper block 14 in response to an external command, and controls the power supply 15. The control circuit 16 executes one kind of or a plurality of kinds of reading procedures until the resistive state of the memory cell is determined. The control circuit 16 may include such as an ECC circuit to perform error detection/correction of data read from the memory cell array 11.

Memory Cell and Memory Cell Array

Figure 2:
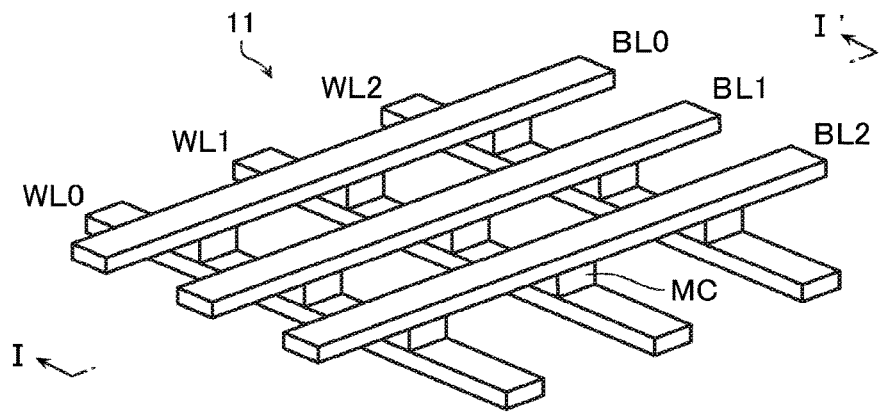
FIG. 2 is a perspective view of a part of a memory cell array 11 of the semiconductor memory device according to the first embodiment.
Figure 3:
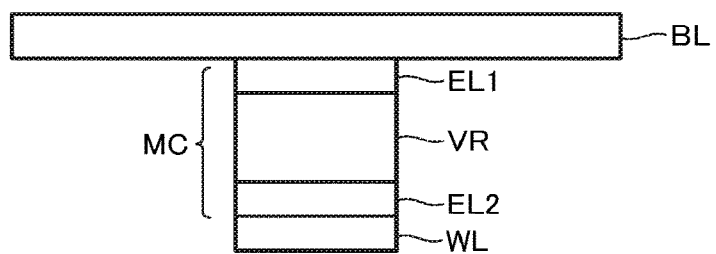
FIG. 3 is a cross-sectional view of one memory cell viewed in an arrow direction taken along a line I-I' in FIG. 2.

FIG. 2 is a perspective view of a part of the memory cell array 11. FIG. 3 is a cross-sectional view of one memory cell viewed in an arrow direction taken along a line I-I' in FIG. 2.

As a plurality of the first wirings, the word lines WL0 to WL2 are disposed in parallel to one another, and intersecting with the word lines, the bit lines BL0 to BL2 are disposed parallel to one another as a plurality of the second wiring. On each intersection portion of these lines, the memory cell MC is disposed between both wirings. The word line WL and the bit line BL is preferred to be constituted of a heat-resistant and low resistance value material. Then, W, WN, WSi, NiSi, CoSi, and similar material can be used.

As illustrated in FIG. 3, the memory cell MC is formed such that a variable resistive element VR is disposed between electrodes EL1 and EL2, and the electrodes EL1 and EL2 connects to the word line WL and the bit line BL, respectively. The bit line BL, the variable resistive element VR, and the word line WL are connected by the electrodes EL1 and EL2 that interpose between the bit line BL and the variable resistive element VR, and between the variable resistive element VR and the word line WL. As the variable resistive element VR, a material which resistance value can be varied by applying a voltage via an electric field, current, heat, chemical energy, and similar energy. The variable resistive element VR is configured of a film including, for example, silicon oxide ($SiO_x$) as a base material. Specifically, the variable resistive element VR is configured of a single layer film of silicon oxide ($SiO_x$) or a structure where silicon oxide ($SiO_x$) is laminated with a semiconductor and an insulator. As the semiconductor and the insulator laminated with silicon oxide ($SiO_x$), silicon (Si), hafnium oxide ($HfO_x$) or similar material are used. Described later, the variable resistive element VR according to the embodiment has a current-voltage property with respect to an applied voltage that varies depend on the state. This can be used to use the variable resistive element VR as a selection element. As the material used for the electrodes EL1 and EL2, a material including Ag, Ni, Co, Al, Zn, Ti, Ta, Cu, silicon to which impurities are doped, W, Ti, $TiN_x$, $TiSi_x$, $TiSi_xN_y$, Ta, $TaN_x$, or $TaSi_xN_y$ is used. The electrodes EL1 and EL2 may be configured of a different material one another.

Performance of Memory Cell

Applying a certain voltage to the variable resistive element VR of a selected memory cell MC for a certain time causes the variable resistive element VR of the selected memory cell MC to be changed into a setting state that is electrically conducted with a voltage lower than a certain voltage. Hereinafter, the operation to change the variable resistive element VR into the setting state will be referred to as a setting operation.

On the other hand, applying a certain voltage to the variable resistive element VR of the selected memory cell MC for a certain time causes the variable resistive element VR of the selected memory cell MC to be changed into a reset state that is electrically conducted with a voltage higher than a certain voltage. Hereinafter, the operation to change the variable resistive element VR into the reset state will be referred to as a reset operation. The reset state is a state where a cutting distance of a conducting filament disposed in a variable resistive element VR is longer than the setting state.

In the reading operation, a certain read voltage is applied to the variable resistive element VR of the selected memory cell MC. This extends the conducting filament F toward the electrode EL1 side. Between the setting state and the reset state, the voltage of when the conducting filament F extends to reach the electrode EL1 is different. The difference can be used to read out the state of the selected memory cell MC.

A description will be given of the reading operation in more detail. When the memory cell MC is in the setting state, applying a voltage equal to or more than a voltage Vth_s to the memory cell MC causes the current to be flown largely to the memory cell MC. On the other hand, when the memory cell MC is in the reset state, applying a voltage equal to or more than a voltage Vth_r to the memory cell MC causes the current to be flown largely to the memory cell MC.

In this case, the voltage Vth_s is smaller than the voltage Vth_r. Setting the voltage Vread that satisfies a formula Vth_s≤Vread<Vth_r as the read voltage generates a large difference in the current in applying the read voltage Vread between the setting state and the reset state. Based on this current difference, the resistive state of the memory cell MC can be read out as data.

Here, a configuration where controlling the applied voltage in the reading operation causes the voltage smaller than the voltage Vth_s to be applied to the memory cell MC that is non-selected in the reading operation may be employed. This causes the non-selected memory cell MC to be flown very small current. Then, the memory cell MC is ensured to have a function as a selection element.

Performance of Semiconductor Memory Device

Next, a description will be given of a performance to the memory cell MC in detail. As described above, the variable resistive element VR becomes in a low resistance state (the setting state) by the setting operation that applies the voltage at a certain magnitude or more to both ends of the variable resistive element VR. The variable resistive element VR becomes in a high resistance state (the reset state) by the reset operation that applies the voltage at a certain magnitude or more to both ends of the variable resistive element VR.

In the above-described semiconductor memory device, with the reduction of a read current of the memory cell by an increase in the capacity, a noise (read noise) where the read current repeats increase and decrease has been serious. The growing of the read noise is more likely to cause a read error. This will be described with reference to FIG. 4 and FIGS. 5A to 5C.

Figure 4:
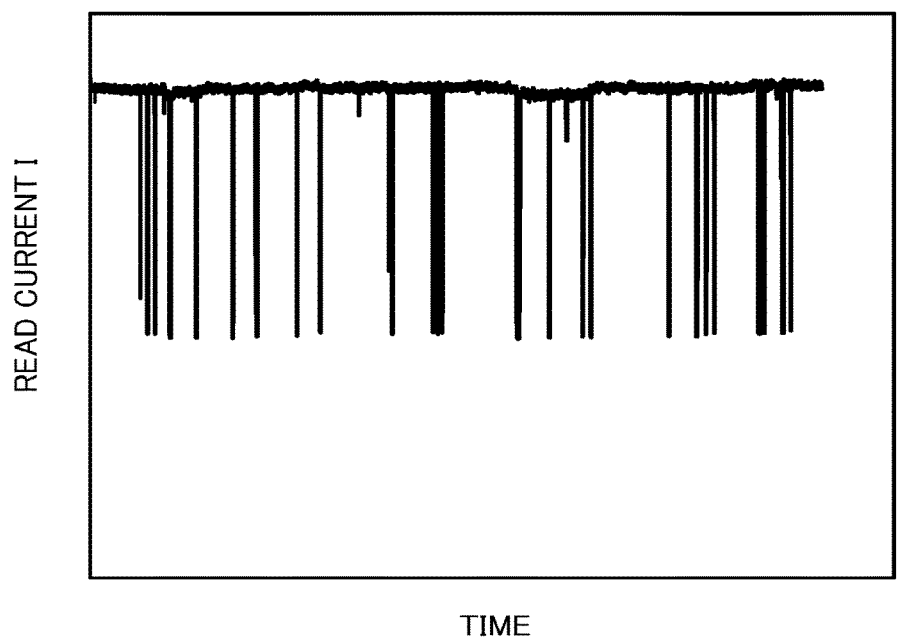
FIG. 4 indicates a time (sampling time*number of times of sampling) dependence of a read current I of the memory cell.
Figure 5A:
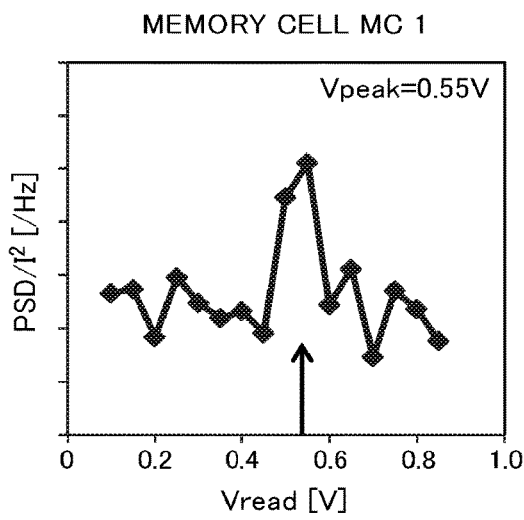
FIGS. 5A to 5C are graphs indicating a read voltage (Vread) dependence of (PSD)/$I^2$.
Figure 5B:
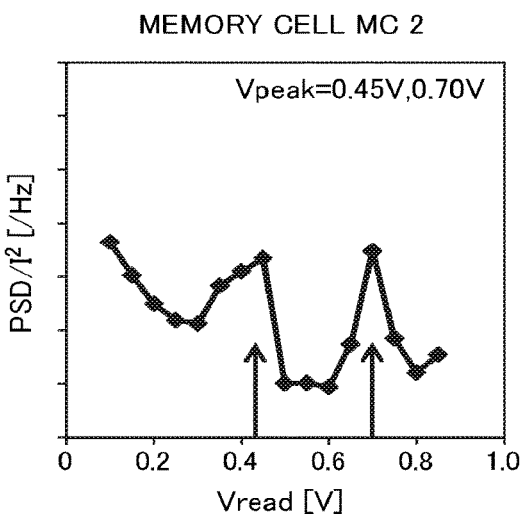
Figure 5C:
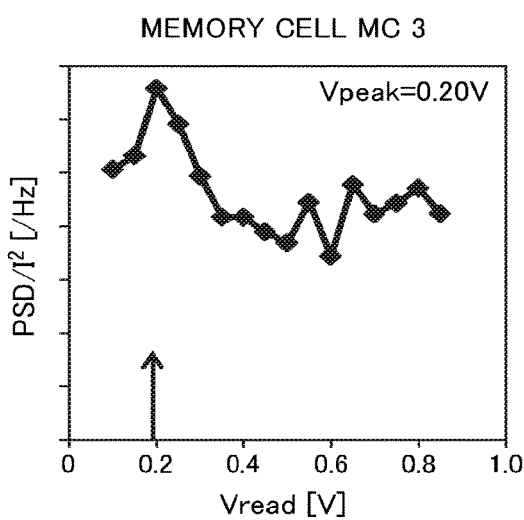

FIG. 4 is an exemplary graph that indicates a relation between a read current I and an elapsed time (read repeat count*reading interval) in a case where the variable resistive element VR repeatedly performs the reading operation with respect to the memory cell (low resistance state) constituted of hafnium oxide ($HfO_x$). FIGS. 5A to 5C indicate a relation between a standard value $PSD/I^2$ and the read voltage Vread. The standard value $PSD/I^2$ is a value where a power spectrum density PSD, which is obtained by performing a fast Fourier transform with respect to an elapsed time dependence of the read current I indicated in, FIG. 4, is standardized by the read current I.

As apparent from the graph in FIG. 4, while the read current I in the case where a certain read voltage is applied to the memory cell in the low resistance state has an approximately constant value in many of the time, small values compared with the above-described constant value are randomly shown because of the influence of the read noise generating infrequently. In other words, the read current I is determined as a typical binary noise that continues to transit between the two states of a high current state and a low current state.

As illustrated in FIGS. 5A to 5C, in one memory cell MC, the standard value $PSD/I^2$ largely varies depending on the read voltage Vread. When the certain read voltage is given, the standard value $PSD/I^2$ obtains a peak voltage Vpeak. As illustrated in FIGS. 5A to 5C, the peak voltage Vpeak is different by the memory cells.

It can be said that, to reduce the influence of the read noise, the reading operation may be performed with the read voltage Vread far from the peak voltage Vpeak. However, apparent from FIGS. 5A to 5C, the peak voltage Vpeak is different by the memory cells. There is no read voltage Vread that ensures to avoid the noise in every memory cell MC.

In consideration of such property of the read noise, the semiconductor memory device of the first embodiment is configured to execute a reading method to effectively eliminate the influence of the read noise.

The reading method of the first embodiment is as follows, in summary.

(1) In one reading operation, a plurality of reading procedures R is executed.

(2) In at least one reading procedure R among the plurality of the reading procedures R, a determination procedure RS that applies a first read voltage to the memory cell MC is performed several times. Each determination procedure RS determines the resistive state of the memory cell.

(3) In one reading procedure R, when any one of the number of a first determination result or the number of a second determination result in the plurality of the determination procedures RS is sufficiently larger than the other, the sufficiently large determination result is employed and the reading operation is terminated.

(4) In the case except the case (3), another reading procedure R' is started to continue the reading operation.

Figure 6:
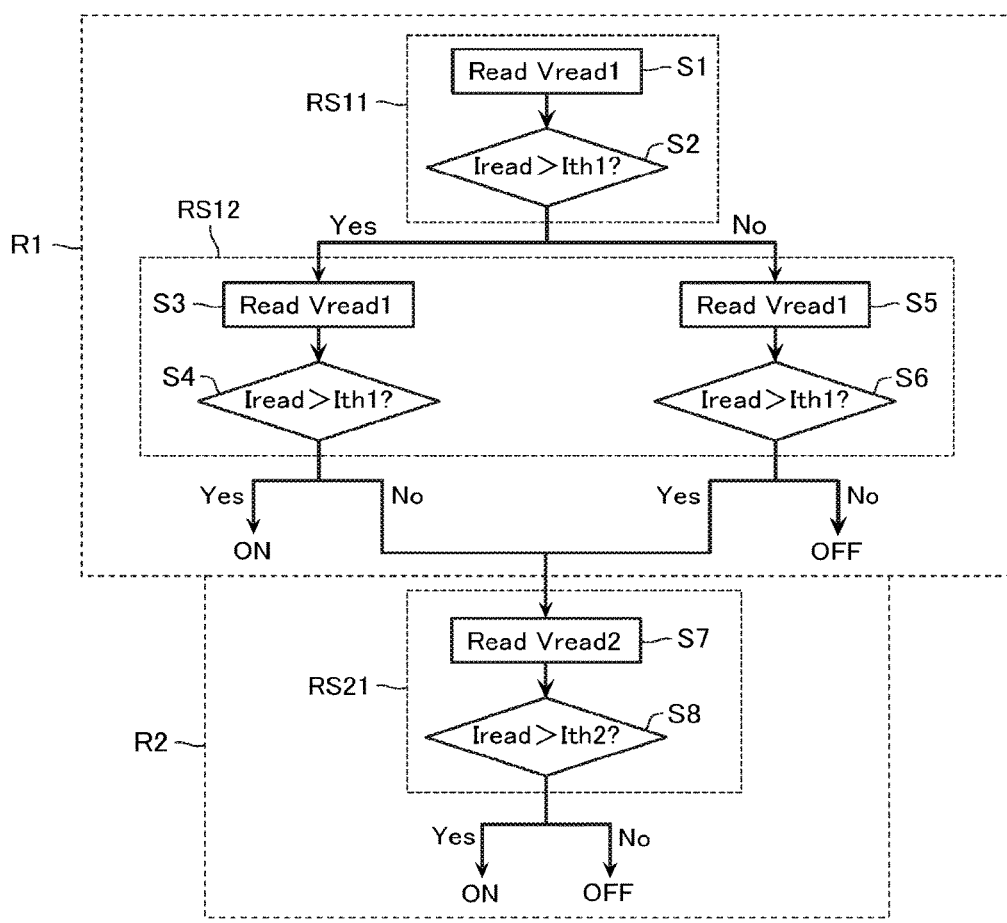
FIG. 6 is a flowchart illustrating a specific example of a reading method according to the first embodiment.
Figure 7:
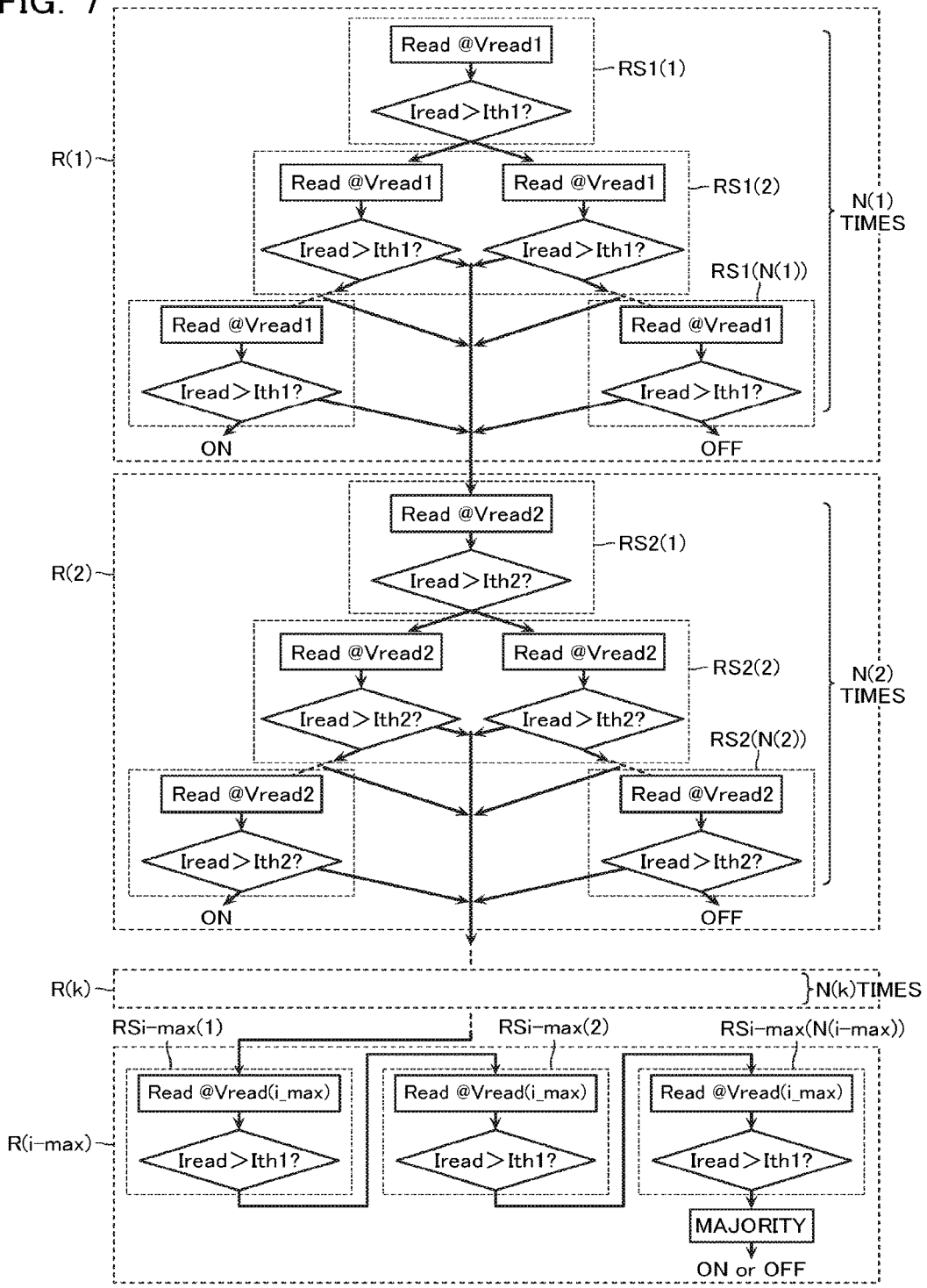
FIG. 7 is a flowchart illustrating a generalized reading method according to the first embodiment.

The following describe the reading method in detail with reference to FIG. 6 and FIG. 7.

The semiconductor memory device according to the embodiment is configured to execute the reading procedure R several times in the reading operation. Then, one reading procedure R further includes the determination procedure RS.

In each determination procedure RS among the plurality of the determination procedure RS included in one reading procedure R, the read voltage Vread is applied to the memory cell MC, then, whether the current flown to the memory cell MC is greater than a threshold current or not is determined.

FIG. 6 illustrates a specific example of the reading method according to the first embodiment to indicate a first reading procedure R1 and a subsequent second reading procedure R2. For the simplification of the description, FIG. 6 indicates the most simplified reading method. That is, the reading operation in FIG. 6 includes two reading procedures R1 and R2. Then, the reading procedure R1 includes two determination procedures RS11 and RS12, and the reading procedure R2 includes one determination procedure RS21.

Next, a description will be given of the performance in each of the reading procedures R1 and R2.

First, a description will be given of the performance of the first reading procedure R1. In the first time determination procedure RS11, a first read voltage Vread 1 is applied to the memory cell MC (Step S1), then, whether the current I flown to the memory cell MC is greater than a first threshold current Ith 1 or not is determined (Step S2).

After the first determination procedure RS11 terminates, the step proceeds to the second time determination procedure RS12. In the second time determination procedure RS12, as well as the first time determination procedure RS11, the first read voltage Vread 1 is applied to the memory cell MC (Step S3, or S5), then, whether the current I flown to the memory cell MC is greater than the first threshold current Ith 1 or not is determined (Step S4, or S6). Steps S3 and S4 indicates a process executed when the determination result in Step S2 is Yes, and Steps S5 and S6 indicates a process executed when the determination result in Step S2 is No. The performance content in Steps S5 and S6 is identical to the performance content in Steps S3 and S4.

When the determination result in Step S2 is Yes and the determination result in Step S4 is similarly Yes, it indicates that the determination results in the two determination procedures of Step S2 and Step S4 are coincident in Yes. In this case, in each determination procedure, as a result, an accurate reading without the influence of the read noise (reading in a state where the peak voltage Vpeak is significantly different from the set Vread 1) is presumably performed. Therefore, the embodiment employs the result that the resistive state of a reading target memory cell MC is the low resistance state (ON) and terminates the reading operation without the additional execution of the other reading operation R2.

When the determination result in Step S2 is No and the determination result in Step S6 is similarly No, it indicates that the determination results in the two determination procedures of Step S2 and Step S4 are coincident in No. In this case, in each determination procedure, as a result, an accurate reading without the influence of the read noise is presumably performed. Therefore, the embodiment employs the result that the resistive state of a reading target memory cell MC is the high resistance state (OFF) and terminates the reading operation without the additional execution of the other reading operation R2.

On the other hand, in the case where, while the determination result in Step S2 is Yes, the determination result in Step S4 is No, it indicates that the determination results in the two determination procedures are different from one another. In this case, in any of the determination procedures RS11 and RS12, a read error is presumably caused by the influence of the read noise. Therefore, the semiconductor memory device according to the embodiment terminates the first reading procedure R1, and proceeds to the second reading procedure R2 of the other reading procedure to continue the reading operation.

In the case where, while the determination result in Step S2 is No, the determination result in Step S6 is Yes, it indicates that the determination results in the two determination procedures are different from one another. In this case, in any of the determination procedures RS11 and RS12, a read error is presumably caused by the influence of the read noise. Therefore, the semiconductor memory device according to the embodiment terminates the first reading procedure R1, and proceeds to the second reading procedure R2 of the other reading procedure to continue the reading operation.

The second reading procedure R2 executes the determination procedure RS21 only once. In the determination procedure RS21, a second read voltage Vread 2 (Vread 2≠Vread 1) is firstly applied to the memory cell MC (Step S7), then, whether the current flowing on the time is greater than a second threshold current Ith 2 or not is determined (Step S8). While in the first reading procedure R1 where the read voltage Vread 1 is used, the read error is occurred because of the influence of the read noise, the second reading procedure R2 uses the read voltage Vread 2 different from the read voltage Vread 1. Using the different read voltage Vread 2 reduces the probability to have the influence of the read noise. This reduces the possibility of the read error (see FIGS. 5A to 5C).

If the determination result in Step S8 is Yes, the resistive state of the memory cell MC is determined to be the low resistance state (ON), and if the determination result in Step S8 is No, the resistive state of the memory cell MC is determined to be the high resistance state (OFF). The determination result in the determination procedure RS21 is employed as the determination result in the reading procedure R2, and the determination result is output as a read value in the reading operation. Then, the reading operation is terminated.

FIG. 6 illustrates the most simplified performance where the number of the reading procedure R included in the reading operation is two at the maximum, and the number of the determination procedure RS included in the reading procedure R is two at the maximum. In contrast to this, FIG. 7 is a flowchart that indicates the reading operation of the embodiment in a more generalized form. In other words, FIG. 6 is one form of FIG. 7.

In FIG. 7, the reading procedure R (i) of i_max times at the maximum (i=1, 2 . . . k, . . . i_max) is performed.

Then, in one reading procedure R (i), the determination procedure RSi (j) is repeated N (i) times at the maximum. In each reading procedure R (i), when all the determination results of the determination procedures RSi (j) of N (i) times are coincident, the determination result is employed and the reading operation is terminated.

On the other hand, when the determination result of one determination procedure RSa (b) in one reading procedure R (a) is different from the determination result of the determination procedure RSa (b') (b'<b) executed previously, the performance of the reading procedure R (a) is terminated at the time, and the step proceeds to the next reading procedure R (a+1).

Instead of this, the coincidence/non-coincidence of the determination results of the determination procedures RS of N (a) times may be determined after the execution of all the determination procedures RS of N (a) times in one reading procedure R (a).

The read voltage Vread (a1) used in the reading procedure R (a1) is different from the read voltage Vread (a0) used in the previous reading procedure R (a0) (However, a1 and a0 are arbitrary natural numbers, a0<a1). Thus, the read voltages Vread differ by the reading procedures are set to ensure the reading operation with much reduced influence of the read noise to be executed (see FIGS. 5A to 5C).

The number of the determination procedures RS included in the reading procedure R executed later is set smaller than the number of the determination procedures RS included in the reading procedure R executed previously. More specifically, when the number of the determination procedures RS in one reading procedure R (a1) is N (a1), and the number of the determination procedures RS in the reading procedure R (a2) (a2>a1, a2 is an arbitrary natural number) executed later is N (a2), the former is set to be identical to the latter, or the latter is set in value smaller than the former. The reason is as follows. That is, the probability that the variable resistive element VR has the peak of the noise in both the read voltage Vread (a1) and Vread (a2) is low. In other words, when the read voltage Vread (a1) has a large influence of the noise, the Vread (a2) is likely less influenced by the noise. Accordingly, the reading procedure R (a2) is expected the high determination accuracy even if the number of the determination procedures RS is smaller than the reading procedure R (a2).

The threshold current Ith (a1) used in the reading procedure R (a1) may be identical to the threshold current Ith (a2) used in the later reading procedure R (a2), or different from the threshold current Ith (a2).

In the second reading procedure R from the last (i_max−1), when the determination results of a plurality of the determination procedures are not coincident, the final reading procedure R (i_max) is executed, and the determination result of the determination procedure in the final reading procedure R (i_max) is employed. The repeat count N (i_max) of the determination procedure in the final reading procedure R (i_max) may be one or more than one (equal to or more than two). In the case where a formula N (i_max)≥2 is satisfied (N (i_max) is the repeat count of the determination procedure), among the determination result of N (i_max) times, the determination result obtained more in any of the low resistance state (ON) and the high resistance state (OFF) is employed in response to the majority. For example, in the case where a formula N (i_max)=3 is satisfied, and among the three determination results, two determination results are the high resistance state (OFF), and only one determination result is the low resistance state (ON), the high resistance state (OFF) is employed as the final determination result (read result). In the case where a formula N (i_max)=1 is satisfied, that is, when the number of the determination procedure of the final reading procedure R (i_max) is one, the determination result of the one determination procedure is employed.

Instead of the simple majority method, for example, when two-thirds or more determination results of all the determination procedures are coincident, the determination result may be employed. When the determination procedures that have a coincidence of the determination result are less than two-thirds of all the determination procedure, the reading operation can be determined as an error.

The number N (i) of the determination procedure included in the one reading procedure R (i) may be configured to be freely changed after shipment.

Effects

Thus, according to the first embodiment, the reading operation is divided into a plurality of the reading procedures, and further divided into a plurality of the determination procedures. When the determination results of the plurality of the determination procedures in one reading procedure do not have a certain coincidence (consistency), the step proceeds to the next reading procedure. In the next reading procedure, the reading operation is executed with a different read voltage. This reduces the influence of the read noise to execute the accurate reading operation even if the above-described read noise occurs.

Second Embodiment

Next, a description will be given of a semiconductor memory device according to a second embodiment with reference to FIG. 8. The overall configuration of the semiconductor memory device in the second embodiment is otherwise similar to the first embodiment (FIG. 1 to FIG. 3), and therefore such configurations will not be further elaborated here.

The second embodiment is different from the first embodiment in details of the reading operation. In the first embodiment, only in the case where all the determination results in the plurality of the determination procedures in one reading procedure are coincident, the determination result is employed to terminate the reading operation. In the other case, the other reading procedure is started. In contrast to this, in the second embodiment, even if not all the results of the plurality of determination procedures executed in the reading procedure are coincident, when the number of any one of the determination results is sufficiently larger than the other determination result, the determination result of sufficiently large number is employed. In each determination procedure, as well as the first embodiment, the read voltage Vread is applied to the memory cell MC, then whether the current flown to the memory cell MC is greater than the threshold current Ith or not is determined.

Figure 8:
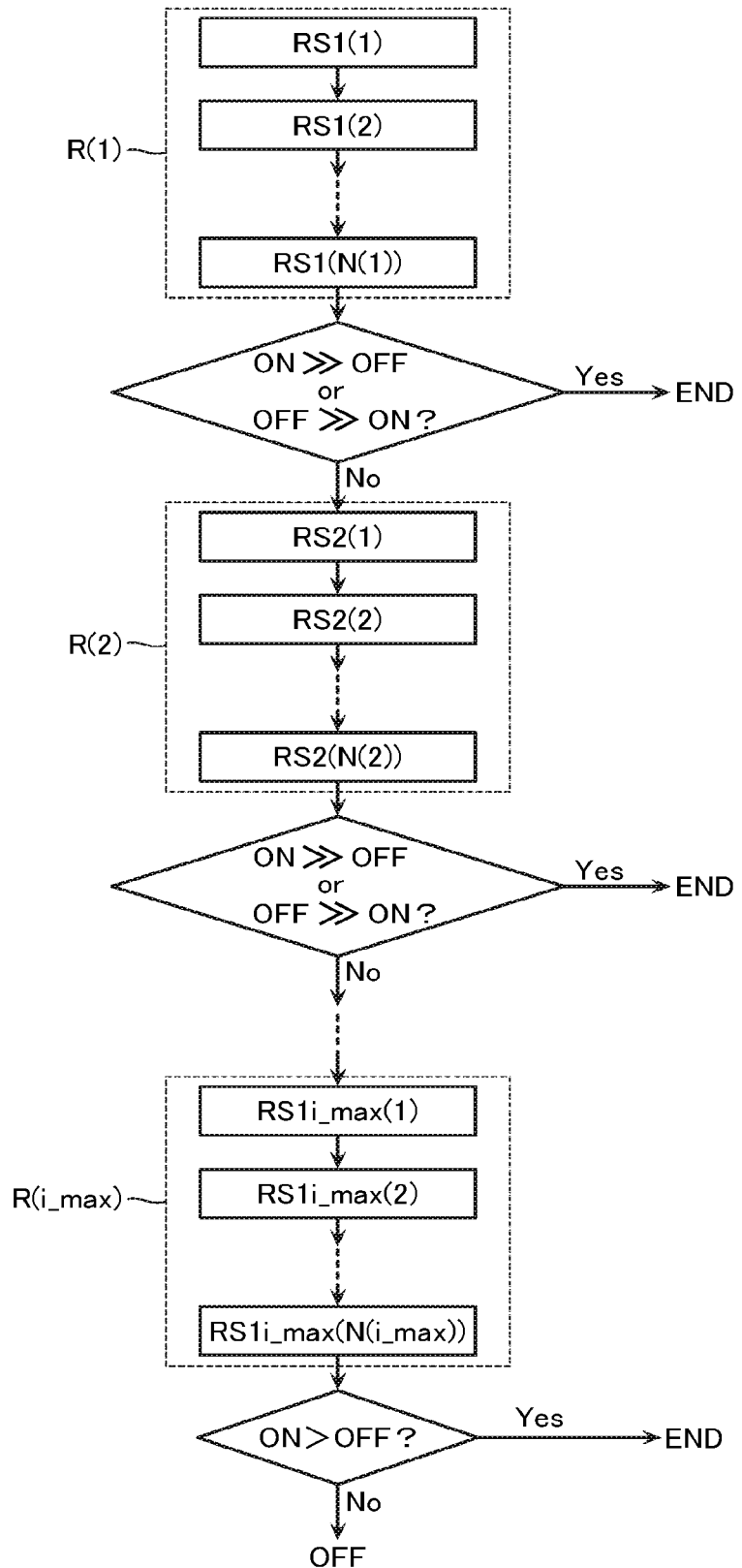
FIG. 8 is a flowchart illustrating a reading method according to a second embodiment.

In FIG. 8, the reading procedure R (i) (i=1, 2 . . . k, . . . i_max) is performed i_max times at the maximum.

Then, in one reading procedure R (i), the determination procedure RSi (j) is repeated N (i) times. Then, in each reading procedure R (i), among the determination results of the N (i) times determination procedure RSi (j), when the number of any one of the determination result is sufficiently larger than the other determination result, the determination result of sufficiently large number is employed to terminate the reading operation.

On the other hand, among determination results of the N (i) times determination procedure RSi (j), when the number of anyone of the determination result is not obtained sufficiently larger than the other determination result, the read error is presumably caused by the influence of the read noise in any of the determination procedure RSi (j). Therefore, in the semiconductor memory device according to the embodiment, the step proceeds to the next reading procedure R (i+1) to continue the reading operation.

Even in the second embodiment, as well as the first embodiment, the read voltage Vread (a1) used in one reading procedure R (a1) is different from the read voltage Vread (a0) used in the previous reading procedure R (a0) (However, a1 and a0 are arbitrary natural numbers, a0<a1). Thus, the read voltages Vread differ by the reading procedures are set to ensure the reading operation with much reduced influence of the read noise to be executed (see FIGS. 5A to 5C).

The number of the determination procedures RS included in the reading procedure R executed later is set smaller than the number of the determination procedures RS included in the reading procedure R executed previously. More specifically, when the number of the determination procedures RS in one reading procedure R (a1) is N (a1), and the number of the determination procedures RS in the reading procedure R (a2) (a2>a1, a2 is an arbitrary natural number) executed later is N (a2), the former is set to be identical to the latter, or the latter is set in value smaller than the former. The reason is as follows. That is, the probability that the variable resistive element VR has the peak of the noise in both the read voltage Vread (a1) and Vread (a2) is low. In other words, when the read voltage Vread (a1) has a large influence of the noise, the Vread (a2) is likely less influenced by the noise. Accordingly, the reading procedure R (a2) is expected the high determination accuracy even if the number of the determination procedures RS is smaller than the reading procedure R (a2).

The threshold current Ith (a1) used in the reading procedure R (a1) may be identical to the threshold current Ith (a2) used in the later reading procedure R (a2), or different from the threshold current Ith (a2).

In the second reading procedure R from the last (i_max−1), when the number of any one of the determination result is not obtained sufficiently larger than the other determination result among the determination results in the plurality of the determination procedures, the final reading procedure R (i_max) is executed, and the determination result of the determination procedure in the final reading procedure R (i_max) is employed. The repeat count N (i_max) of the determination procedure in the final reading procedure R (i_max) may be one or more than one (equal to or more than two). In the case where a formula N (i_max)≥2 is satisfied (N (i_max) is the repeat count of the determination procedure), among the determination results of N (i_max) times, the determination result obtained more in any of the low resistance state (ON) and the high resistance state (OFF) is employed in response to the majority. For example, in the case where a formula N (i_max)=3 is satisfied, and among the three determination results, two determination results are the high resistance state (OFF), and only one determination result is the low resistance state (ON), the high resistance state (OFF) is employed as the final determination result (read result). In the case where a formula N (i_max)=1 is satisfied, that is, when the number of the determination procedure of the final reading procedure R (i_max) is one, the determination result of the one determination procedure is employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first wiring;
a second wiring intersecting with the first wiring;
a memory cell disposed on an intersection portion of the first wiring and the second wiring, the memory cell including a variable resistive element; and
a control circuit that controls a voltage applied to the memory cell, wherein
the control circuit applies a read voltage with respect to the memory cell for a plurality of times to determine a resistive state of the memory cell for a plurality of times, so as to obtain a first determination result or a second determination result, and
the control circuit compares a number of the first determination result with a number of the second determination result, terminates a reading operation when the comparison result suggests that an accurate reading is performed, and starts the reading operation again when the comparison result suggests that a read error is caused.

2. The semiconductor memory device according to claim 1, wherein
the read voltage applied to the memory cell have different values between the reading operation executed previously and the reading operation executed later.

3. The semiconductor memory device according to claim 2, wherein
a number of times of determination in the reading operation executed later is smaller than a number of times of determination in the reading operation executed previously.

4. The semiconductor memory device according to claim 1, wherein
in the reading operation executed previously and the reading operation executed later, the resistive state of the memory cell is determined based on magnitude relation between a current flown to the memory cell and a first threshold current or a second threshold current, the second threshold current being different from the first threshold current.

5. The semiconductor memory device according to claim 2, wherein
in the reading operation executed previously and the reading operation executed later, the resistive state of the memory cell is determined based on magnitude relation between a current flown to the memory cell and a first threshold current or a second threshold current, the second threshold current being different from the first threshold current.

6. The semiconductor memory device according to claim 3, wherein in the reading operation executed previously and the reading operation executed later, the resistive state of the memory cell is determined based on magnitude relation between a current flown to the memory cell and a first threshold current or a second threshold current, the second threshold current being different from the first threshold current.

7. The semiconductor memory device according to claim 4, wherein
the second threshold current is identical to the first threshold current.

8. The semiconductor memory device according to claim 1, wherein
in the reading operation executed finally, even if difference between the number of the first determination result and the number of the second determination result does not suggest that the accurate reading is performed in the previous reading operation, the reading operation is terminated.

9. The semiconductor memory device according to claim 1, wherein
when all the determination results are coincident, the reading operation is terminated.

10. The semiconductor memory device according to claim 1, wherein
when one of the number of the first determination result and the number of the second determination result is larger than the other by a predetermined number or more, the reading operation is terminated.

11. A control method of a semiconductor memory device, the semiconductor memory device including:
a first wiring;
a second wiring intersecting with the first wiring; and
a memory cell disposed on an intersection portion of the first wiring and the second wiring, the memory cell including a variable resistive element,
the control method comprising:
applying a first read voltage with respect to the memory cell for a plurality of times to determine a resistive state of the memory cell for a plurality of times, so as to obtain a first determination result or a second determination result, and
comparing the number of the first determination result with a number of the second determination result, to terminate a reading operation when comparison result suggests that an accurate reading is performed, and to start the reading operation again when the comparison result suggests that a read error is caused.

12. The control method of the semiconductor memory device according to claim 11, wherein
the read voltages applied to the memory cell have different values between the reading operation executed previously and the reading operation executed later.

13. The control method of the semiconductor memory device according to claim 12, wherein
a number of times of determination in the reading operation executed later is smaller than a number of times of determination in the reading operation executed previously.

14. The control method of the semiconductor memory device according to claim 11, wherein
in the reading operation executed previously and the reading operation executed later, the resistive state of the memory cell is determined based on magnitude relation between a current flown to the memory cell and a first threshold current or a second threshold current, the second threshold current being different from the first threshold current.

15. The control method of the semiconductor memory device according to claim 12, wherein
in the reading operation executed previously and the reading operation executed later, the resistive state of the memory cell is determined based on magnitude relation between a current flown to the memory cell and a first threshold current or a second threshold current, the second threshold current being different from the first threshold current.

16. The control method of the semiconductor memory device according to claim 13, wherein
in the reading operation executed previously and the reading operation executed later, the resistive state of the memory cell is determined based on magnitude relation between a current flown to the memory cell and a first threshold current or a second threshold current, the second threshold current being different from the first threshold current.

17. The control method of the semiconductor memory device according to claim 14, wherein
the second threshold current is identical to the first threshold current.

18. The control method of the semiconductor memory device according to claim 11, wherein
in the reading operation executed finally, even if difference between the number of the first determination result and the number of the second determination result does not suggest that the accurate reading is performed in the previous reading operation, the reading operation is terminated.

19. The control method of the semiconductor memory device according to claim 11, wherein
when all the determination results of the resistive state of the memory cell are coincident, the reading operation is terminated.

20. The control method of the semiconductor memory device according to claim 11, wherein
when one of the number of the first determination result and the number of the second determination result is larger than the other by a predetermined number or more, the reading operation is terminated.

* * * * *